United States Patent
El-Kik et al.

(10) Patent No.: US 7,157,932 B2
(45) Date of Patent: Jan. 2, 2007

(54) ADJUSTING SETTINGS OF AN I/O CIRCUIT FOR PROCESS, VOLTAGE, AND/OR TEMPERATURE VARIATIONS

(75) Inventors: Tony S. El-Kik, Allentown, PA (US); Anthony W. Seaman, Bethlehem, PA (US); Stefan A. Siegel, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 126 days.

(21) Appl. No.: 10/999,857

(22) Filed: Nov. 30, 2004

(65) Prior Publication Data

US 2006/0114017 A1 Jun. 1, 2006

(51) Int. Cl.
*H03K 19/003* (2006.01)

(52) U.S. Cl. ............................ 326/32; 326/30; 326/31; 326/33; 327/108

(58) Field of Classification Search ............ 326/30–33, 326/38; 327/108
See application file for complete search history.

(56) References Cited

U.S. PATENT DOCUMENTS

| | | | |
|---|---|---|---|
| 5,337,254 A * | 8/1994 | Knee et al. ..................... 716/1 |
| 6,222,354 B1 * | 4/2001 | Song ........................... 323/273 |
| 6,417,705 B1 | 7/2002 | Tursi et al. |
| 6,509,757 B1 | 1/2003 | Humphrey |
| 6,646,483 B1 | 11/2003 | Shin |
| 6,670,821 B1 | 12/2003 | Ajit |
| 6,683,482 B1 | 1/2004 | Humphrey et al. |
| 6,703,908 B1 | 3/2004 | Ruesch et al. |
| 7,020,818 B1 * | 3/2006 | Dour et al. ................... 714/724 |
| 7,034,608 B1 * | 4/2006 | Gai et al. ....................... 330/9 |
| 2004/0090240 A1 | 5/2004 | Ajit |

FOREIGN PATENT DOCUMENTS

EP 1 341 307 A1 3/2003
EP 1 326 343 A1 9/2003

* cited by examiner

*Primary Examiner*—James Cho
*Assistant Examiner*—Jason Crawford

(57) ABSTRACT

A control circuit and method for controlling the electrical characteristics of an input/output (I/O) circuit such as an output driver to account for variations in fabrication process, supply voltage, and/or temperature (PVT) conditions includes a PVT controller having appropriate control logic to permit PVT compensation to be observed, tested, and selectively adjusted. The PVT controller permits selection between PVT sensing circuit-provided control signals and control signals stored in a hardware register for controlling drive strength. The PVT controller further provides the capability to offset the selected drive strength by a fixed amount and select whether or not the offset is applied and permits full testability and observability of the selected control signal, an offset value applied thereto, and the resulting output signal.

62 Claims, 3 Drawing Sheets

| DRIVE STRENGTH | COUT[2] | COUT[1] | COUT[0] | FOUT[2] | FOUT[1] | FOUT[0] | INDEX VALUE |
|---|---|---|---|---|---|---|---|
| 0 | 0 | 0 | 0 | 0 | 0 | 0 | 0 |
| 14 | 0 | 0 | 0 | 0 | 0 | 1 | 1 |
| 28 | 0 | 0 | 0 | 0 | 1 | 1 | 2 |
| 42 | 0 | 0 | 0 | 1 | 1 | 1 | 3 |
| 56 | 0 | 0 | 1 | 0 | 0 | 0 | 4 |
| 70 | 0 | 0 | 1 | 0 | 0 | 1 | 5 |
| 84 | 0 | 0 | 1 | 0 | 1 | 1 | 6 |
| 98 | 0 | 0 | 1 | 1 | 1 | 1 | 7 |
| 112 | 0 | 1 | 1 | 0 | 0 | 0 | 8 |
| 126 | 0 | 1 | 1 | 0 | 0 | 1 | * |
| 140 | 0 | 1 | 1 | 0 | 1 | 1 | * |
| 154 | 0 | 1 | 1 | 1 | 1 | 1 | * |
| 132 | 1 | 0 | 0 | 0 | 0 | 0 | 9 |
| 146 | 1 | 0 | 0 | 0 | 0 | 1 | 10 |
| 160 | 1 | 0 | 0 | 0 | 1 | 1 | 11 |
| 174 | 1 | 0 | 0 | 1 | 1 | 1 | 12 |
| 188 | 1 | 0 | 1 | 0 | 0 | 0 | 13 |
| 202 | 1 | 0 | 1 | 0 | 0 | 1 | 14 |
| 216 | 1 | 0 | 1 | 0 | 1 | 1 | 15 |
| 230 | 1 | 0 | 1 | 1 | 1 | 1 | 16 |
| 244 | 1 | 1 | 1 | 0 | 0 | 0 | 17 |
| 258 | 1 | 1 | 1 | 0 | 0 | 1 | 18 |
| 272 | 1 | 1 | 1 | 0 | 1 | 1 | 19 |
| 286 | 1 | 1 | 1 | 1 | 1 | 1 | 20 |

ADJUSTING SETTINGS OF AN I/O CIRCUIT FOR PROCESS, VOLTAGE, AND/OR TEMPERATURE VARIATIONS

BACKGROUND OF THE INVENTION

1. Technical Field

The present invention relates generally to controlling electrical characteristics associated with input/output (I/O) circuits, and more particularly, to observing, testing, and adjusting the settings of an I/O circuit such as an output driver to account for variations in fabrication process, supply voltage, and/or temperature (PVT) conditions.

2. Prior Art

I/O circuits are used to interface traditional circuitry such as integrated circuits (ICs) with electrical environments external to the IC. An I/O circuit acts as a driver for signals generated by the IC and provides these signals to a pad, which, in turn, interfaces with the external electrical environment. In addition or alternatively, an I/O circuit may receive signals from the external electrical environment through the pad. A critical challenge in the design, fabrication, and operation of these I/O circuits is that their electrical characteristics, e.g., impedances, voltages, and rise and fall times of waveforms, may vary depending on the particular PVT conditions, thereby causing timing and/or noise problems (such as overshoot and undershoot).

In order to create independence between the electrical characteristics of the I/O circuits and PVT conditions, it is desirable that the slew rate, i.e., the change in pad voltage with rise time/fall time, be relatively constant. In other words, the transient current drive of the I/O circuit should be independent of the PVT conditions.

With reference now to FIG. 1, a block diagram of one typical prior art solution for keeping the slew rate of an I/O circuit independent of PVT conditions is illustrated. As shown, an exemplary output driver system 100 includes internal logic 106, an output driver 104, and a PVT sensing circuit 102. The internal logic 106 provides an input signal to the output driver 104, which, in turn, drives the input signal to provide a corresponding output signal. The drive strength of the output driver 104 is adjustable, so as to allow for PVT compensation. The PVT compensation is achieved by providing a six-bit control signal to the output driver 104, where the control signal consists of three coarse bits (C[2:0]) and three fine bits (F[2:0]). These six bits, which represent a linear range with uniform increments, selectively activate one or more of a plurality of leg circuits in the output driver 104 to vary the drive strength. In the system 100 of FIG. 1, the PVT sensing circuit 102 senses the current at an external reference resistor 108 to characterize the PVT conditions, determines an appropriate PVT compensation amount in real time, and generates a corresponding six-bit control signal, which it provides to the output driver 104 so that the output driver 104 can vary its drive strength accordingly. Depending on the application, the output driver system 100 might not include a PVT sensing circuit 102 at all. In this scenario, instead of utilizing a PVT sensing circuit to provide the six-bit control signal, a stored control signal would be provided to the output driver 104 from a six-bit control register (not shown).

SUMMARY OF THE INVENTION

In the prior art system 100 of FIG. 1, the PVT sensing circuit 102 provides control signals to the output driver 104, and disadvantageously, the system 100 contains no control logic to permit selectively bypassing or adjusting the control signal from the PVT sensing circuit 102 under certain circumstances, e.g., to compensate for loads having varying impedances. Moreover, no functionality is provided for testing or observing the PVT settings, or for controlling the PVT of the output driver 104 through software. Such control logic could permit selection between (1) control signals provided by the PVT sensing circuit and (2) control signals stored in a hardware register. Additionally, control logic could (i) provide the capability to offset the selected control signal by a fixed amount and (ii) select whether or not the offset is applied. Moreover, having logic control could permit full testability and observability of the selected control signal, an offset value applied thereto, and the resulting output signal.

In certain embodiments, the present invention provides a control circuit and method for controlling the PVT settings of an VO circuit, such as an output driver, whereby a PVT controller having appropriate control logic is provided so as to permit PVT compensation to be observed, tested, and selectively adjusted. The PVT controller permits selection between control signals provided by a PVT sensing circuit and control signals stored in a hardware register. The PVT controller further (1) provides the capabilities to offset the selected control signal by a fixed amount and select whether or not the offset is applied and (2) permits full testability and observability of the selected control signal, an offset value applied thereto, and the resulting output signal.

In one embodiment, the present invention provides an input/output (I/O) system for generating an output signal from an input signal. The I/O system includes an I/O device adapted to receive the input signal and generate the output signal based on the input signal. The generation of the output signal by the I/O device is affected by one or more environmental conditions associated with the I/O device. The I/O device is further adapted to receive an I/O-device control signal corresponding to the one or more environmental conditions. The I/O device is adapted to adjust the generation of the output signal based on the I/O-device control signal. The system further includes a condition sensor adapted to generate a sensed condition signal that characterizes the one or more environmental conditions, and a controller adapted to (i) receive the sensed condition signal from the condition sensor and a programmable offset value and (ii) modify the sensed condition signal based on the programmable offset value to generate and provide the I/O-device control signal to the I/O device.

In another embodiment, the present invention provides a method for generating an output signal from an input signal using an I/O system that includes an I/O device and a condition sensor. The I/O device receives the input signal and generates the output signal based on the input signal, wherein the generation of the output signal by the I/O device is affected by one or more environmental conditions associated with the I/O device. The I/O device receives an I/O-device control signal corresponding to the one or more environmental conditions. The I/O device adjusts the generation of the output signal based on the I/O -device control signal. The condition sensor generates a sensed condition signal that characterizes the one or more environmental conditions. The method includes (a) receiving the sensed condition signal from the condition sensor and a programmable offset value; and (b) modifying the sensed condition signal based on the programmable offset value to generate and provide the I/O-device control signal to the I/O device.

In yet another embodiment, the present invention provides a controller for an I/O system adapted to generate an output signal from an input signal. The I/O system includes an I/O device and a condition sensor. The I/O device is adapted to receive the input signal and generate the output signal based on the input signal. The generation of the output signal by the I/O device is affected by one or more environmental conditions associated with the I/O device. The I/O device is further adapted to receive an I/O-device control signal corresponding to the one or more environmental conditions. The I/O device is adapted to adjust the generation of the output signal based on the I/O-device control signal. The condition sensor is adapted to generate a sensed condition signal that characterizes the one or more environmental conditions, and the controller is adapted to (i) receive the sensed condition signal from the condition sensor and a programmable offset value and (ii) modify the sensed condition signal based on the programmable offset value to generate and provide the I/O-device control signal to the I/O device.

In still another embodiment, an I/O system for generating an output signal from an input signal includes an I/O device adapted to receive the input signal and generate the output signal based on the input signal. The generation of the output signal by the I/O device is affected by one or more environmental conditions associated with the I/O device. The I/O device is further adapted to receive an I/O-device control signal corresponding to the one or more environmental conditions, and the I/O device is adapted to adjust the generation of the output signal based on the I/O-device control signal. The system further includes a condition sensor adapted to generate a sensed condition signal that characterizes the one or more environmental conditions, and a controller adapted to (i) receive the sensed condition signal from the condition sensor, a specified condition signal, and a mode control signal, and (ii) determine, based on the value of the mode control signal, whether to generate and provide the I/O-device control signal to the I/O device using the sensed condition signal or the specified condition signal.

BRIEF DESCRIPTION OF THE DRAWINGS

The invention is described in detail with regard to the following figures, wherein like numbers reference like elements, and wherein.

DETAILED DESCRIPTION OF THE PREFERRED EMBODIMENTS

In accordance with exemplary embodiments of the present invention, a PVT controller having appropriate control logic is provided so as to permit PVT compensation to be observed, tested, and selectively adjusted. The PVT controller permits selection between PVT sensing circuit-provided control signals and control signals stored in a hardware register, provides the capability to offset the selected control signal by a fixed amount and select whether or not the offset is applied, and permits full testability and observability of the selected control signal, an offset value applied thereto, and the resulting output signal.

Figure 1:
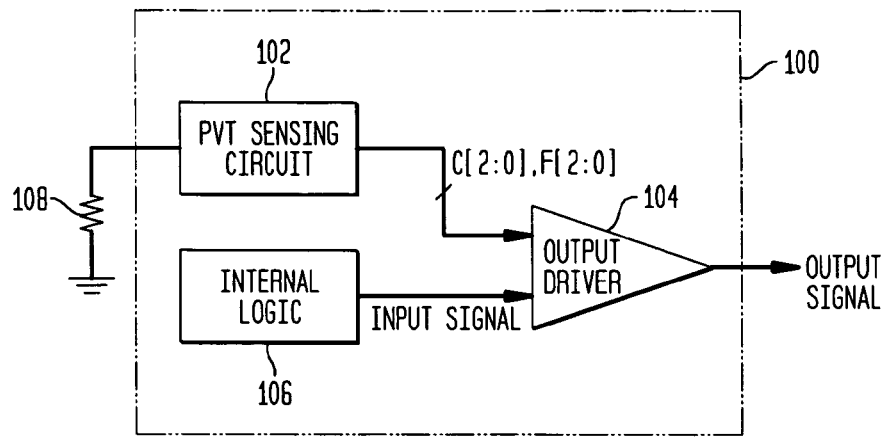
FIG. 1 shows a block diagram of an exemplary prior art output driver system that includes a PVT sensing circuit.
Figure 2:
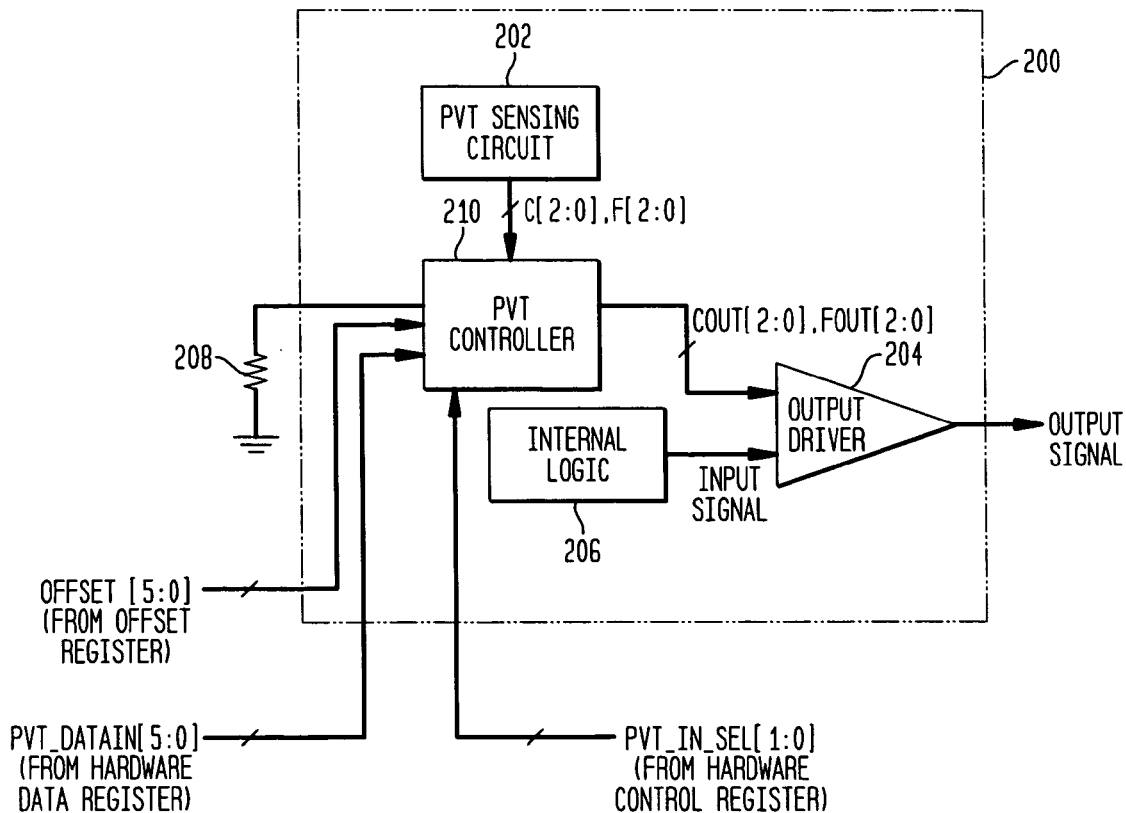
FIG. 2 shows a block diagram of an exemplary output driver system that includes a PVT sensing circuit and a PVT controller, consistent with certain embodiments of the present invention.

With reference first to FIG. 2, a block diagram of an exemplary output driver system 200 consistent with the invention is illustrated. As shown, the output driver system 200 includes internal logic 206, an output driver 204, a PVT sensing circuit 202, and a PVT controller 210. The internal logic 206 provides an input signal to the output driver 204, which, in turn, drives the input signal and provides an output signal. The drive strength of the output driver 204 is adjustable, so as to allow for PVT compensation. The PVT compensation is achieved by providing a six-bit control signal to the output driver 204, consisting of three coarse bits (COUT[2:0]) and three fine bits (FOUT[2:0]). As will be described in further detail below, these six bits, which correspond to a non-linear range with non-uniform increments, selectively activate one or more of a plurality of leg circuits in the output driver 204 to vary the drive strength.

In the system 200 of FIG. 2, the PVT sensing circuit 202 senses the current at an external reference resistor 208 (e.g., 1 k ohm), determines an appropriate PVT compensation amount in real time, and generates a corresponding six-bit control signal. However, rather than providing the control signal directly to the output driver 204 as in the prior art, the PVT sensing circuit 202 instead provides the control signal (C[2:0], F[2:0]) to the PVT controller 210. The PVT controller 210 may additionally receive a stored six-bit control signal (PVT_DATAIN[5:0]) from an (internal or external) hardware data register (not shown) that can be provided to the output driver 204 in lieu of the control signal (C[2:0], F[2:0]) from the PVT sensing circuit 202.

The PVT controller 210 may further receive a programmable six-bit offset value (OFFSET[5:0]) stored in an (internal or external) hardware offset register (not shown) that can be summed with an index value corresponding to (i) the control signal (C[2:0], F[2:0]) from the PVT sensing circuit 202 or (ii) the stored control signal (PVT_DATAIN[5:0]) to permit additional adjustment thereto. Based on appropriate control logic and a two-bit control signal (PVT_IN_SEL[1:0]) from an (internal or external) hardware control register (not shown), the PVT controller 210 provides a possibly adjusted six-bit control signal (COUT[2:0], FOUT[2:0]) to the output driver 204. As will be described in greater detail below, the PVT controller 210 performs several functions that collectively determine the appropriate adjusted (or unadjusted) control signal (COUT[2:0], FOUT[2:0]) to provide to the output driver 204.

Figures 3, 4:
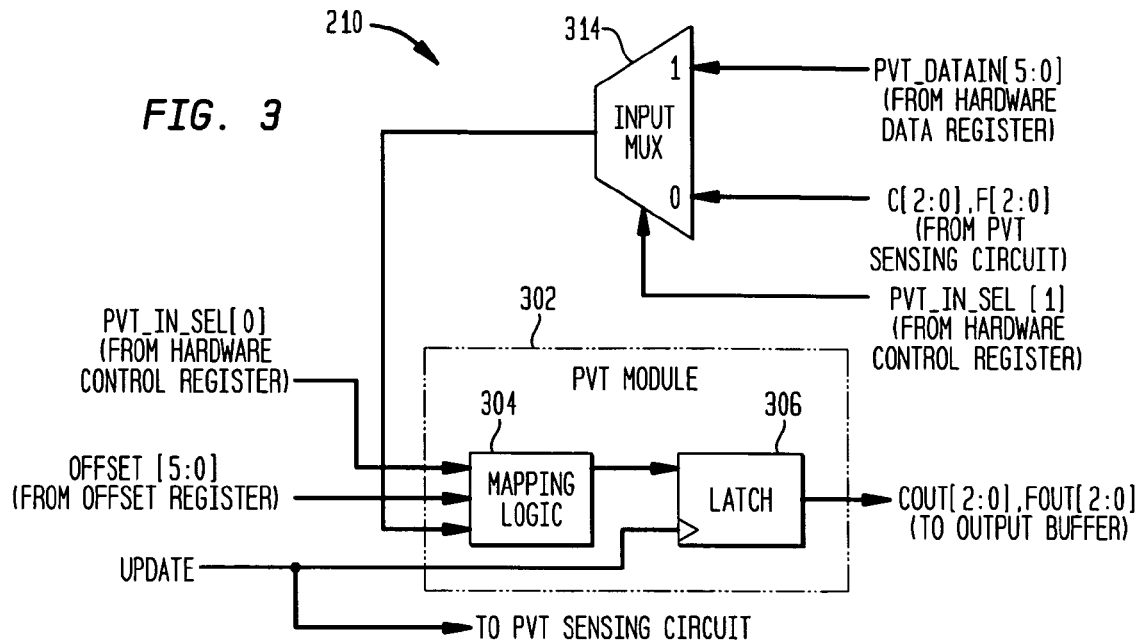
FIG. 3 shows a block diagram of an exemplary embodiment of the PVT controller of FIG. 2.
FIG. 4 shows an exemplary look-up table used in the mapping logic of the exemplary embodiment of the PVT controller of FIG. 2.

Turning now to FIG. 3, a block diagram of an exemplary embodiment of the PVT controller 210 of FIG. 2 is illustrated. As shown, the PVT controller 210 includes an input multiplexer 314 (or other switching device) and a PVT module 302 containing mapping logic 304 and a latch 306. The input multiplexer 314 receives the six-bit control signal (C[2:0], F[2:0]) from the PVT sensing circuit 202 and may additionally receive the stored six-bit control signal (PVT_DATAIN[5:0]) that can be provided to the output driver 204 in lieu of the control signal (C[2:0], F[2:0]) from the PVT sensing circuit 202.

The input multiplexer 314 further receives a selection control signal (PVT_IN_SEL[1]), which determines which control signal is selected for output to the PVT module 302, i.e., if the selection control signal (PVT_IN_SEL[1]) is low, then the control signal (C[2:0], F[2:0]) from the PVT sensing circuit 202 is provided to the PVT module 302, and if the selection control signal (PVT_IN_SEL[1]) is high, then the stored control signal (PVT_DATAIN[5:0]) is provided to the PVT module 302, bypassing the output from the PVT sensing circuit 202 altogether. The capability to select between PVT sensing circuit-provided and stored control signals advantageously permits adjustability and customization to accommodate varying PVT conditions and loads.

The mapping logic 304 includes a look-up table, such as the exemplary table 400 shown in FIG. 4. Whereas, in the prior art, the drive strength of the output driver 104 is varied using combinations of six control bits to generate a linear range with uniform increments for selective activation of one or more of a plurality of leg circuits in the output driver 104, the drive strength of the output driver 204 in the present invention can be, but does not have to be, varied non-linearly, still using six control bits. Specifically, in one implementation, there are three coarse bits (COUT[2:0]) and three fine bits (FOUT[2:0]). Each fine bit turns on a leg of the output driver 204 of substantially equal magnitude. Coarse bits COUT[1] and COUT[0] also turn on legs of the output driver 204 of substantially equal magnitude, and these legs are about four times the strength of one fine-bit leg. Coarse bit COUT[2] turns on a leg of the output driver 204 that is about 9.4 times the strength of a fine-bit leg. Thus, the total drive strength of the output driver 204 can vary from 0 (driver off) to 286 (all bits on), where each fine bit corresponds to a drive strength of 14 (i.e., ((3×1)+(2× 4)+9.4)×14=286).

As shown in the table 400 of FIG. 4, the look-up table maps each combination of six bits to both a drive strength and an index value. It should be noted that exemplary table 400 may be considered to be a reduced representation of a full $2^6$-entry table. For example, since FOUT[2], FOUT[1], and FOUT[0] are all of equal weight, each turning on a driver leg of equal strength, FOUT[2:0]=001 is the same as FOUT[2:0]=010 and FOUT[2:0]=001, and thus, only one of these combinations is represented in the exemplary table 400. It should be understood that in other implementations employing driver legs of other relative strengths, all three of the foregoing bit combinations FOUT[2:0]=001, FOUT[2:0]=010, and FOUT[2:0]=001 might not all be of equal weight, and that the values included in the look-up table 400 of FIG. 4 are merely exemplary.

The index values in table 400 indicate the relative strengths of each of the bit combinations output by the PVT controller 210. Although the drive strengths vary non-linearly, it can be seen that the progression is quite close to being linear, such that the user can adjust the drive strength of the output driver 204 in "steps" of approximately 14, wherein each step effects approximately the same change in output drive strength. In certain other embodiments of the present invention, the drive strength progression could, in fact, have a linear range.

It is noted that when COUT[2] is on, a break in the linearity of drive strengths occurs, since COUT[2] is not an integer multiple strength of COUT[1] or COUT[0]. Thus, turning on the control bits in an orderly fashion results in a discontinuity. For this reason, in one implementation, the three bit combinations marked with an asterisk in the exemplary table 400 of FIG. 4 are not used, and the table skips from 011000 to 100000. Thus, in this embodiment, all of the drive strength increases are in increments of 14, except for the jump from 112 to 132, which is an increase of 20.

While it is contemplated that, in this embodiment, a control signal (C[2:0], F[2:0]) from the PVT sensing circuit 202 or a stored control signal (PVT_DATAIN[5:0]) will only be a valid bit combination, appropriate logic may be provided to remap an invalid bit combination, such as one of those marked with an asterisk in the exemplary table 400 of FIG. 4, to a valid combination, in the event an invalid combination is received as a control signal (C[2:0], F[2:0]) from a PVT sensing circuit or as a stored control signal (PVT_DATAIN[5:0]).

The foregoing drive strength incrementation scheme, while preferred, is merely exemplary, and other implementations consistent with the present invention are possible. For example, an alternative scheme might employ one or more of the three bit combinations marked with an asterisk in the table 400 of FIG. 4, mapping these bit combinations to corresponding index values, rather than skipping them altogether. It should also be recognized that, in certain embodiments consistent with the present invention, magnitudes different from those set forth above might alternatively be assigned to each of the coarse and fine bits, and/or numbers of bits other than six could alternatively be used.

The mapping logic 304 of the PVT module 302 receives the selected control signal (C[2:0], F[2:0] or PVT_DATAIN [5:0]) from the input multiplexer 314, and may also receive, from an offset register, the stored offset value (OFFSET[5:0]), which may be a positive or negative integer or zero. The mapping logic 304 further receives a selection control signal (PVT_IN_SEL[0]) from a hardware control register, which determines whether or not the offset value (OFFSET[5:0]) is summed with the index value corresponding to the selected control signal (C[2:0], F[2:0] or PVT_DATAIN[5:0]) before the selected control signal is provided to the output buffer, i.e., if the selection control signal (PVT_IN_SEL[0]) is low, the offset value (OFFSET[5:0]) is summed with the index value corresponding to the selected control signal, e.g., using an internal adder or summing circuit (not shown), and if the selection control signal (PVT_IN_SEL[0]) is high, no offset adjustment is made to the index value of the selected control signal.

The mapping logic 304 effects the summation by retrieving the index value of the selected control signal (C[2:0], F[2:0] or PVT_DATAIN[5:0]) from the look-up table 400, summing the retrieved index value with the offset value (OFFSET[5:0]), thereby obtaining a resulting index value, and then retrieving the six-bit combination that corresponds to the resulting index value. This six-bit combination is the adjusted control signal (COUT[2:0], FOUT[2:0]) that will be provided to the output driver 204. For example, if PVT_IN_SEL[1:0]=00 (i.e., provide the control signal from the PVT sensing circuit 202 to the PVT module 302 and sum the control signal with the offset value), if the output of the PVT sensing circuit 202 is C[2:0], F[2:0]=100011 (index value 11, drive strength 160), and if the offset value (OFFSET[5:0]) is +3, then the resulting index value is 14 (drive strength 202), and the adjusted control signal (COUT[2:0], FOUT[2:0]) provided to the output driver 204 is 101001, i.e., COUT[2], COUT[0], and FOUT[0] on. In the foregoing example, if the offset value (OFFSET[5:0]) were −4, then the resulting index value would be 7 (drive strength 98), and the adjusted control signal (COUT[2:0], FOUT[2:0]) provided to the output driver 204 would be 001111, i.e., COUT[0], FOUT[2], FOUT[1], and FOUT[0] on.

In certain embodiments, the mapping logic 304 may be configured never to output an index value of 0 (all bits off), and may be configured to keep the output driver 204 turned on by keeping FOUT[0] on if the summation results in a value less than 1. The mapping logic 304 may also be configured to output an index value of 20 (all bits on) if the summation generates a resulting index value exceeding 20.

The capability to offset the selected control signal by a fixed amount, as well as to select whether or not the offset is applied, advantageously permits further adjustability and customization to accommodate varying PVT conditions and loads.

The mapping logic 304 provides the adjusted (or unadjusted) control signal (COUT[2:0], FOUT[2:0]) via the latch 306 to the output driver 204. The latch 306 also receives as input an UPDATE clock signal for controlling the timing of the updates of its stored six-bit value. Unlike the prior art, wherein a control signal from a PVT sensing circuit is only updated following a reset signal, in the present invention, the UPDATE clock signal is set so that the adjusted (or unadjusted) control signal (COUT[2:0], FOUT[2:0]) may be provided whenever the output of the output driver 204 is in a steady state, in sleep mode, or is otherwise inactive, to protect the integrity of the data being provided by the output driver 204 during an update. It should further be noted that the UPDATE clock signal is also provided to the PVT sensing circuit 202, which updates its latch on the falling edge of the UPDATE signal, while the latch 306 of the PVT controller is updated on the next rising edge of the UPDATE signal, thereby providing sufficient time for the control signal (C[2:0], F[2:0]) from the PVT sensing circuit 202 to be provided to the PVT module 302.

Thus, three principal modes of operation for the PVT controller 210 are selectable using the two-bit selection control signal (PVT_IN_SEL[1:0]): normal mode (PVT_IN_SEL[1:0]=00), testing mode (PVT_IN_SEL[1:0]=10), and transparent mode (PVT_IN_SEL[1:0]=11). Note that a PVT_IN_SEL[1:0] value of (01) is not used and may be reserved for other functions, e.g., selecting between two different UPDATE signals. In normal mode, the PVT controller 210 provides full functionality by summing the index value corresponding to the control signal (C[2:0], F[2:0]) output from the PVT sensing circuit 202 with the offset value (OFFSET[5:0]). In testing mode, the index value corresponding to the stored control signal (PVT_DATAIN[5:0]) is summed with the stored offset value (OFFSET[5:0]), which permits the output of the PVT module 302 to be observed. In transparent mode, the PVT controller 210 passes the stored control signal (PVT_DATAIN[5:0]) directly to its output, which permits all of the output bits of the PVT controller 210 to be 0, thereby facilitating testing using automated test equipment (ATE), e.g., by performing a "walking ones" test to verify that each of the six legs of the output driver 204 is intact.

Figure 5:
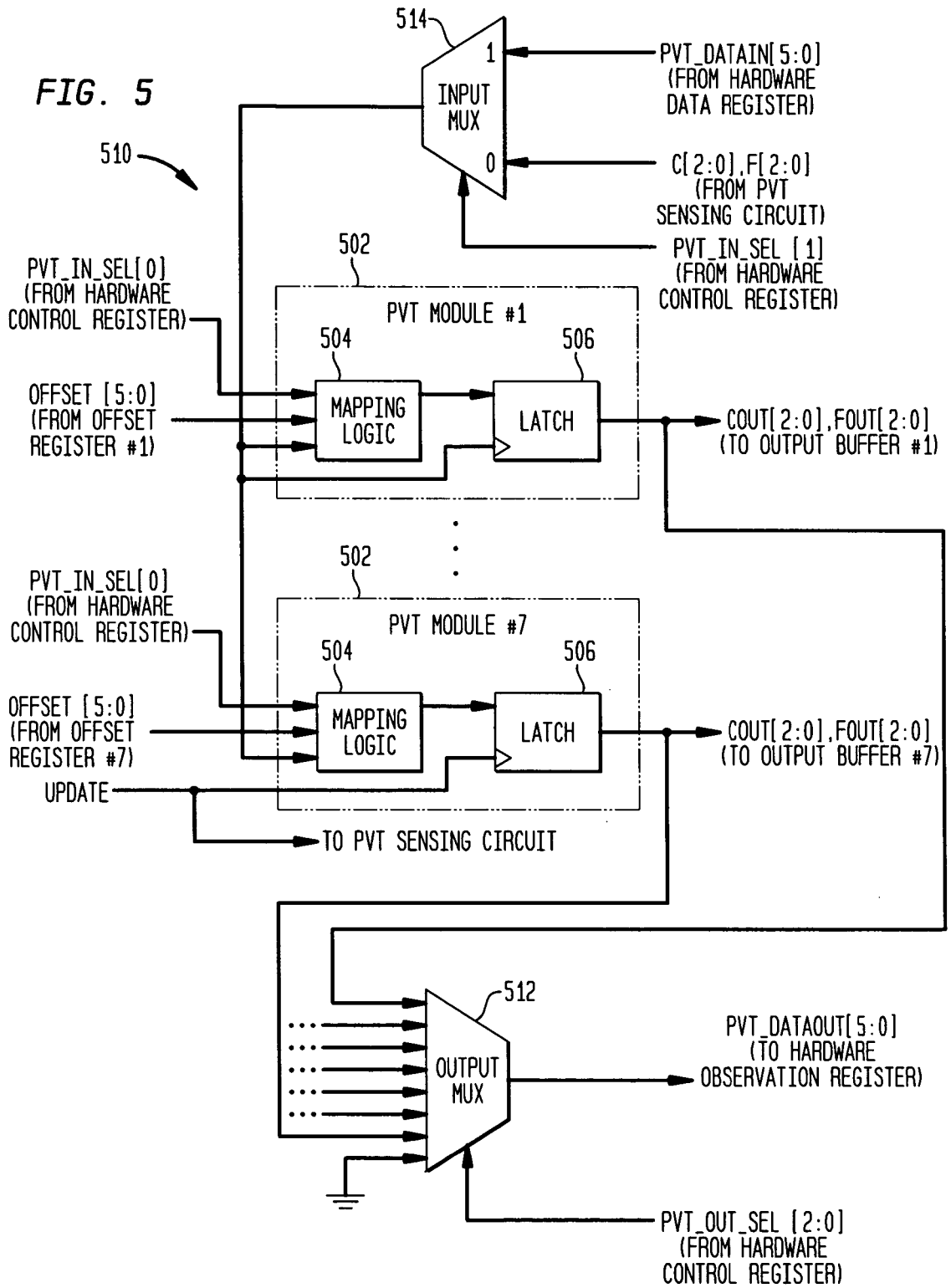
FIG. 5 shows a block diagram of another exemplary embodiment of a PVT controller consistent with certain embodiments of the present invention, for use with an output driver system that includes seven output drivers configured in parallel.

Referring now to FIG. 5, a block diagram of another exemplary embodiment of a PVT controller 510 consistent with the present invention, for use with an output driver system that includes seven output drivers configured in parallel, is illustrated. As shown, the PVT controller 510 includes an input multiplexer 514 (or other switching device) and seven PVT modules 502, each containing mapping logic 504 and a latch 506. It should be understood that, while this embodiment employs seven PVT modules 502 for use with seven output drivers, other numbers of PVT modules 502 consistent with the present invention may alternatively be used. The structure and function of each of the PVT modules 502 and input multiplexer 514 are substantially the same as in the PVT module 302 and input multiplexer 314 described above with respect to the exemplary embodiment of the PVT controller 210 of FIG. 2, and a description of these details will therefore not be repeated with particular reference to this embodiment of the PVT controller 510.

The PVT controller 510 further includes an output multiplexer 512 (or other switching device) that receives a selection control signal (PVT_OUT_SEL[2:0]) from a hardware control register, which determines which adjusted control signal (COUT[2:0], FOUT[2:0]) from among the seven PVT modules 502 is output as PVT_DATAOUT[5:0], which is a signal that may be received by an observation register. Thus, PVT_DATAOUT[5:0] may be observed, thereby advantageously permitting full testability of the block-control of the offset value (OFFSET[5:0]) and input control signals (C[2:0], F[2:0] or PVT_DATAIN[5:0]), as well as observability of its outputs (COUT[2:0], FOUT[2:0]), e.g., when the PVT controller 510 is in test mode. It is further noted that, in this embodiment, a single PVT sensing circuit may be used with all seven of the output drivers, or alternatively, seven separate PVT sensing circuits could be used, one for each of the output drivers.

It should be understood that, while the present invention is described herein as being implemented in an output driver system, the invention could alternatively be implemented in other circuits or systems, e.g., input drivers and other I/O circuits or systems, and should not be construed as being limited to output driver circuits. Additionally, while the embodiments set forth herein are described as having particular utility in adjusting drive strength, e.g., output voltage and/or slew rate, it is contemplated that a circuit or method consistent with the present invention could alternatively be used to adjust other input and/or output electrical characteristics of a circuit, e.g., waveform rise/fall times or impedances. Further, it should be recognized that components other than the PVT sensing circuit described herein may be used to determine an appropriate PVT compensation offset, and such sensing may alternatively be performed by generating a sensed condition signal that characterizes the PVT conditions using an external reference voltage, time difference, or electrical characteristic other than current measured at a reference resistor. Moreover, it should be understood that the use of the term "PVT" herein may be used to describe one or more of fabrication process, supply voltage, and temperature conditions, but does not necessarily include all three conditions. It should also be recognized that the term "PVT," as used in this specification as well as in the appended claims, may additionally or alternatively refer to environmental conditions other than fabrication process, supply voltage, and temperature conditions, and that the present invention should be construed to include the adjustment and/or control of circuit settings for such other conditions, as well.

While aspects of the exemplary embodiments of the present invention have been described herein as circuit-based processes and with respect to methods implemented within a single system, various functions may be implemented in the digital domain as processing steps in a software program, by digital logic, or in combination of both software and hardware. Such software may be employed in, for example, a digital signal processor, micro-controller or general-purpose computer. Such hardware and software may be embodied within circuits implemented in one or more ICs.

Although the steps in the method claims that follow may be recited in a particular sequence, those steps are not necessarily intended to be limited to being implemented in that particular sequence.

While the invention is susceptible to various modifications and alternative forms, specific embodiments thereof have been shown by way of example in the drawings and have been described in detail. It should be understood, however, that it is not intended to limit the invention to the particular forms disclosed, but on the contrary, the intention is to cover all modifications, equivalents and alternatives falling within the spirit and scope of the invention as defined by the appended claims.

What is claimed is:

1. An input/output (I/O) system for generating an output signal from an input signal, the I/O system comprising:
   an I/O device adapted to receive the input signal and generate the output signal based on the input signal, wherein:
      the generation of the output signal by the I/O device is affected by one or more environmental conditions associated with the I/O device;
      the I/O device is further adapted to receive an I/O-device control signal corresponding to the one or more environmental conditions; and
      the I/O device is adapted to adjust the generation of the output signal based on the I/O-device control signal;
   a condition sensor adapted to generate a sensed condition signal that characterizes the one or more environmental conditions; and
   a controller adapted to (i) receive the sensed condition signal from the condition sensor and a programmable offset value and (ii) modify the sensed condition signal based on the programmable offset value to generate and provide the I/O-device control signal to the I/O device, wherein the controller is adapted to:
   map the sensed condition signal to an index value;
   adjust the index value based on the programmable offset value to generate an adjusted index value; and
   map the adjusted index value to the I/O-device control signal.

2. The invention of claim 1, wherein the I/O device is an output driver.

3. The invention of claim 1, wherein the one or more environmental conditions comprise one or more of process, voltage, and temperature associated with the I/O device.

4. The invention of claim 1, wherein:
   the sensed condition signal and the I/O-device control signal are multi-bit signals;
   the controller comprises a look-up table (LUT) that maps the multi-bit sensed condition signal to the index value;
   the controller is adapted to generate the adjusted index value by summing the index value and the programmable offset value; and
   the controller is adapted to apply the LUT to map the adjusted index value to the multi-bit I/O-device control signal.

5. The invention of claim 4, wherein:
   the I/O device comprises a plurality of leg circuits; and
   the I/O device is adapted to use each bit of the multi-bit I/O-device control signal to determine whether to turn on or off a corresponding one of the leg circuits.

6. The invention of claim 5, wherein the relationship between the relative effect on the generation of the output signal for at least two leg circuits corresponds to a non-integer multiple.

7. The invention of claim 5, wherein:
   the sensed condition signal is electrical current measured at a resistor;
   the I/O device is adapted to adjust the generation of the output signal by altering one or more electrical characteristics of the output signal selected from the group consisting of: drive strength, slew rate, output voltage, waveform rise time, waveform fall time, and impedance;
   at least one of the sensed condition signal and the I/O-device control signal comprises three coarse bits and three fine bits; and
   wherein the relationship between the relative effect on the generation of the output signal for the leg circuits is such that (i) each of the fine bits turns on leg circuits of substantially equal magnitude, (ii) two of the coarse bits turn on leg circuits of approximately 4 times the magnitude of one of the fine bit-controlled leg circuits, and (iii) one of the coarse bits turns on a leg circuit of approximately 9.4 times the magnitude of one of the fine bit-controlled leg circuits.

8. The invention of claim 4, wherein the LUT has one or more invalid bit combinations for the multi-bit sensed condition signal.

9. The invention of claim 8, wherein the controller is adapted to map an invalid bit combination to an index value corresponding to a valid bit combination.

10. The invention of claim 1, wherein:
    the condition sensor and the controller are adapted to receive an update signal;
    the condition sensor is adapted to update the sensed condition signal at each falling edge of the update signal; and
    the controller is adapted to update the I/O-device control signal at each rising edge of the update signal.

11. The invention of claim 10, wherein the controller is adapted to receive a specified condition signal and a mode control signal; and
    the controller is adapted to determine, based on the value of the mode control signal, whether to generate the I/O-device control signal using the sensed condition signal or the specified condition signal.

12. The invention of claim 1, wherein:
    the controller is adapted to receive a mode control signal; and
    the controller is adapted to determine, based on the value of the mode control signal, whether or not to ignore the programmable offset value when generating the I/O-device control signal.

13. The invention of claim 1, wherein:
    the controller is adapted to receive a specified condition signal and a mode control signal; and
    the controller is adapted to determine, based on the value of the mode control signal, whether to generate the I/O-device control signal using the sensed condition signal or the specified condition signal.

14. The invention of claim 1, wherein:
    the controller is adapted to receive a mode control signal; and
    the controller is adapted to determine, based on the value of the mode control signal, whether or not to modify the sensed condition signal based on the programmable offset value when generating the I/O-device control signal.

15. The invention of claim 1, wherein the I/O system comprises:
    a plurality of I/O devices, each adapted to receive a corresponding input signal and generate a corresponding output signal based on the corresponding input signal, wherein:
       the generation of the corresponding output signal by each I/O device is affected by one or more environmental conditions associated with the I/O device;

each I/O device is further adapted to receive a corresponding I/O-device control signal corresponding to the one or more environmental conditions; and each I/O device is adapted to adjust the generation of the corresponding output signal based on the corresponding I/O-device control signal;

a plurality of controllers, each adapted to (i) receive a corresponding sensed condition signal from a corresponding condition sensor and a corresponding programmable offset value and (ii) modify the corresponding sensed condition signal based on the corresponding programmable offset value to generate and provide the corresponding I/O-device control signal to a corresponding I/O device.

16. The invention of claim 15, wherein:

the I/O system comprises a single condition sensor; and each controller receives its corresponding sensed condition signal from the single condition sensor.

17. The invention of claim 1, wherein the I/O system is one of an input driver, an output driver, and an integrated circuit.

18. A method for generating an output signal from an input signal using an I/O system, the I/O system comprising an I/O device and a condition sensor, wherein:

the I/O device receives the input signal and generates the output signal based on the input signal, wherein the generation of the output signal by the I/O device is affected by one or more environmental conditions associated with the I/O device;

the I/O device receives an I/O-device control signal corresponding to the one or more environmental conditions;

the I/O device adjusts the generation of the output signal based on the I/O-device control signal; and the condition sensor generates a sensed condition signal that characterizes the one or more environmental conditions, wherein the method comprises;

(a) receiving the sensed condition signal from the condition sensor and a programmable offset value; and (b) modifying the sensed condition signal based on the programmable offset value to generate and provide the I/O-device control signal to the I/O device, wherein step (b) further comprises:

mapping the sensed condition signal to an index value;

adjusting the index value based on the programmable offset value to generate an adjusted index value; and mapping the adjusted index value to the I/O-device control signal.

19. The invention of claim 18, wherein the method further comprises:

receiving an update signal;

updating the sensed condition signal at each falling edge of the update signal; and updating the I/O-device control signal at each rising edge of the update signal.

20. The invention of claim 19, wherein the method further comprises:

receiving a specified condition signal and a mode control signal; and determining, based on the value of the mode control signal, whether to generate the I/O-device control signal using the sensed condition signal or the specified condition signal.

21. The invention of claim 18, wherein the method further comprises:

receiving a specified condition signal and a mode control signal; and determining, based on the value of the mode control signal, whether to generate the I/O-device control signal using the sensed condition signal or the specified condition signal.

22. A controller for an I/O system adapted to generate an output signal from an input signal, the I/O system comprising an I/O device and a condition sensor, wherein:

the I/O device is adapted to receive the input signal and generate the output signal based on the input signal, wherein:

the generation of the output signal by the I/O device is affected by one or more environmental conditions associated with the I/O device;

the I/O device is further adapted to receive an I/O-device control signal corresponding to the one or more environmental conditions; and the I/O device is adapted to adjust the generation of the output signal based on the I/O-device control signal;

the condition sensor is adapted to generate a sensed condition signal that characterizes the one or more environmental conditions; and the controller is adapted to (i) receive the sensed condition signal from the condition sensor and a programmable offset value and (ii) modify the sensed condition signal based on the programmable offset value to generate and provide the I/O-device control signal to the I/O device, wherein the controller is adapted to:

map the sensed condition signal to an index value;

adjust the index value based on the programmable offset value to generate an adjusted index value; and map the adjusted index value to the I/O-device control signal.

23. The invention of claim 22, wherein:

the condition sensor and the controller are adapted to receive an update signal;

the condition sensor is adapted to update the sensed condition signal at each falling edge of the update signal; and the controller is adapted to update the I/O-device control signal at each rising edge of the update signal.

24. The invention of claim 23, wherein:

the controller is adapted to receive a specified condition signal and a mode control signal; and the controller is adapted to determine, based on the value of the mode control signal, whether to generate the I/O-device control signal using the sensed condition signal or the specified condition signal.

25. The invention of claim 22, wherein:

the controller is adapted to receive a specified condition signal and a mode control signal; and the controller is adapted to determine, based on the value of the mode control signal, whether to generate the I/O-device control signal using the sensed condition signal or the specified condition signal.

26. The invention of claim 22, wherein the I/O system is one of an input driver, an output driver, and an integrated circuit.

27. An I/O system for generating an output signal from an input signal, the I/O system comprising:

an I/O device adapted to receive the input signal and generate the output signal based on the input signal, wherein:

the generation of the output signal by the I/O device is affected by one or more environmental conditions associated with the I/O device;

the I/O device is further adapted to receive an I/O-device control signal corresponding to the one or more environmental conditions; and the I/O device is adapted to adjust the generation of the output signal based on the I/O-device control signal;

a condition sensor adapted to generate a sensed condition signal that characterizes the one or more environmental conditions; and a controller adapted to (i) receive the sensed condition signal from the condition sensor, a specified condition signal, and a mode control signal, and (ii) determine, based on the value of the mode control signal, whether to generate and provide the I/O-device control signal to the I/O device using the sensed condition signal or the specified condition signal.

28. The invention of claim 27, wherein the controller is adapted to:

map the sensed condition signal to an index value;

adjust the index value based on the programmable offset value to generate an adjusted index value; and map the adjusted index value to the I/O-device control signal.

29. The invention of claim 28, wherein:

the condition sensor and the controller are adapted to receive an update signal;

the condition sensor is adapted to update the sensed condition signal at each falling edge of the update signal; and the controller is adapted to update the I/O-device control signal at each rising edge of the update signal.

30. The invention of claim 29, wherein:

the controller is adapted to receive a specified condition signal and a mode control signal; and the controller is adapted to determine, based on the value of the mode control signal, whether to generate the I/O-device control signal using the sensed condition signal or the specified condition signal.

31. The invention of claim 28, wherein:

the controller is adapted to receive a specified condition signal and a mode control signal; and the controller is adapted to determine, based on the value of the mode control signal, whether to generate the I/O-device control signal using the sensed condition signal or the specified condition signal.

32. The invention of claim 27, wherein:

the condition sensor and the controller are adapted to receive an update signal;

the condition sensor is adapted to update the sensed condition signal at each falling edge of the update signal; and the controller is adapted to update the I/O-device control signal at each rising edge of the update signal.

33. The invention of claim 32, wherein:

the controller is adapted to receive a specified condition signal and a mode control signal; and the controller is adapted to determine, based on the value of the mode control signal, whether to generate the I/O-device control signal using the sensed condition signal or the specified condition signal.

34. The invention of claim 27, wherein:

the controller is adapted to receive a specified condition signal and a mode control signal; and the controller is adapted to determine, based on the value of the mode control signal, whether to generate the I/O-device control signal using the sensed condition signal or the specified condition signal.

35. An input/output (I/O) system for generating an output signal from an input signal, the I/O system comprising:

an I/O device adapted to receive the input signal and generate the output signal based on the input signal, wherein:

the generation of the output signal by the I/O device is affected by one or more environmental conditions associated with the I/O device;

the I/O device is further adapted to receive an I/O-device control signal corresponding to the one or more environmental conditions; and the I/O device is adapted to adjust the generation of the output signal based on the I/O-device control signal;

a condition sensor adapted to generate a sensed condition signal that characterizes the one or more environmental conditions; and a controller adapted to (i) receive the sensed condition signal from the condition sensor and a programmable offset value and (ii) modify the sensed condition signal based on the programmable offset value to generate and provide the I/O-device control signal to the I/O device, wherein:

the condition sensor and the controller are adapted to receive an update signal;

the condition sensor is adapted to update the sensed condition signal at each falling edge of the update signal; and the controller is adapted to update the I/O-device control signal at each rising edge of the update signal.

36. The invention of claim 35, wherein:

the controller is adapted to receive a specified condition signal and a mode control signal; and the controller is adapted to determine, based on the value of the mode control signal, whether to generate the I/O-device control signal using the sensed condition signal or the specified condition signal.

37. An input/output (I/O) system for generating an output signal from an input signal, the I/O system comprising:

an I/O device adapted to receive the input signal and generate the output signal based on the input signal, wherein:

the generation of the output signal by the I/O device is affected by one or more environmental conditions associated with the I/O device;

the I/O device is further adapted to receive an I/O-device control signal corresponding to the one or more environmental conditions; and the I/O device is adapted to adjust the generation of the output signal based on the I/O-device control signal;

a condition sensor adapted to generate a sensed condition signal that characterizes the one or more environmental conditions; and a controller adapted to (i) receive the sensed condition signal from the condition sensor and a programmable offset value and (ii) modify the sensed condition signal based on the programmable offset value to generate and provide the I/O-device control signal to the I/O device, wherein:

the controller is adapted to receive a specified condition signal and a mode control signal; and the controller is adapted to determine, based on the value of the mode control signal, whether to generate the I/O-device control signal using the sensed condition signal or the specified condition signal.

38. A method for generating an output signal from an input signal using an I/O system, the I/O system comprising an I/O device and a condition sensor, wherein:

the I/O device receives the input signal and generates the output signal based on the input signal, wherein the generation of the output signal by the I/O device is affected by one or more environmental conditions associated with the I/O device;

the I/O device receives an I/O-device control signal corresponding to the one or more environmental conditions;

the I/O device adjusts the generation of the output signal based on the I/O-device control signal; and the condition sensor generates a sensed condition signal that characterizes the one or more environmental conditions, wherein the method comprises:

(a) receiving the sensed condition signal from the condition sensor and a programmable offset value; and (b) modifying the sensed condition signal based on the programmable offset value to generate and provide the I/O-device control signal to the I/O device, wherein the method further comprises:

receiving an update signal;

updating the sensed condition signal at each falling edge of the update signal; and updating the I/O-device control signal at each rising edge of the update signal.

39. The invention of claim 38, wherein the method further comprises:

receiving a specified condition signal and a mode control signal; and determining, based on the value of the mode control signal, whether to generate the I/O-device control signal using the sensed condition signal or the specified condition signal.

40. A method for generating an output signal from an input signal using an I/O system, the I/O system comprising an I/O device and a condition sensor, wherein:

the I/O device receives the input signal and generates the output signal based on the input signal, wherein the generation of the output signal by the I/O device is affected by one or more environmental conditions associated with the I/O device;

the I/O device receives an I/O-device control signal corresponding to the one or more environmental conditions;

the I/O device adjusts the generation of the output signal based on the I/O-device control signal; and the condition sensor generates a sensed condition signal that characterizes the one or more environmental conditions, wherein the method comprises:

(a) receiving the sensed condition signal from the condition sensor and a programmable offset value; and (b) modifying the sensed condition signal based on the programmable offset value to generate and provide the I/O-device control signal to the I/O device, wherein the method further comprises:

receiving a specified condition signal and a mode control signal; and determining, based on the value of the mode control signal, whether to generate the I/O-device control signal using the sensed condition signal or the specified condition signal.

41. A method for generating an output signal from an input signal using an I/O system, the I/O system comprising an I/O device and a condition sensor, wherein:

the I/O device receives the input signal and generates the output signal based on the input signal, wherein the generation of the output signal by the I/O device is affected by one or more environmental conditions associated with the I/O device;

the I/O device receives an I/O-device control signal corresponding to the one or more environmental conditions;

the I/O device adjusts the generation of the output signal based on the I/O-device control signal; and the condition sensor generates a sensed condition signal that characterizes the one or more environmental conditions, wherein the method comprises:

(a) receiving the sensed condition signal from the condition sensor, a specified condition signal, and a mode control signal, and (b) determining, based on the value of the mode control signal, whether to generate and provide the I/O-device control signal to the I/O device using the sensed condition signal or the specified condition signal.

42. The invention of claim 41, wherein step (b) further comprises:

mapping the sensed condition signal to an index value;

adjusting the index value based on a programmable offset value to generate an adjusted index value; and maping the adjusted index value to the I/O-device control signal.

43. The invention of claim 42, wherein the method further comprises:

receiving an update signal;

updating the sensed condition signal at each falling edge of the update signal; and updating the I/O-device control signal at each rising edge of the update signal.

44. The invention of claim 43, wherein the method further comprises:

receiving a specified condition signal and a mode control signal; and determining, based on the value of the mode control signal, whether to generate the I/O-device control signal using the sensed condition signal or the specified condition signal.

45. The invention of claim 42, wherein the method further comprises:

receiving a specified condition signal and a mode control signal; and determining, based on the value of the mode control signal, whether to generate the I/O-device control signal using the sensed condition signal or the specified condition signal.

46. The invention of claim 41, wherein the method further comprises:

receiving an update signal;

updating the sensed condition signal at each falling edge of the update signal; and updating the I/O-device control signal at each rising edge of the update signal.

47. The invention of claim 46, wherein the method further comprises:

receiving a specified condition signal and a mode control signal; and determining, based on the value of the mode control signal, whether to generate the I/O-device control signal using the sensed condition signal or the specified condition signal.

48. The invention of claim 41, wherein the method further comprises:

receiving a specified condition signal and a mode control signal; and determining, based on the value of the mode control signal, whether to generate the I/O-device control signal using the sensed condition signal or the specified condition signal.

49. A controller for an I/O system adapted to generate an output signal from an input signal, the I/O system comprising an I/O device and a condition sensor, wherein:

the I/O device is adapted to receive the input signal and generate the output signal based on the input signal, wherein:

the generation of the output signal by the I/O device is affected by one or more environmental conditions associated with the I/O device;

the I/O device is further adapted to receive an I/O-device control signal corresponding to the one or more environmental conditions; and the I/O device is adapted to adjust the generation of the output signal based on the I/O-device control signal;

the condition sensor is adapted to generate a sensed condition signal that characterizes the one or more environmental conditions; and the controller is adapted to (i) receive the sensed condition signal from the condition sensor and a programmable offset value and (ii) modify the sensed condition signal based on the programmable offset value to generate and provide the I/O-device control signal to the I/O device, wherein:

the condition sensor and the controller are adapted to receive an update signal;

the condition sensor is adapted to update the sensed condition signal at each falling edge of the update signal; and the controller is adapted to update the I/O-device control signal at each rising edge of the update signal.

50. The invention of claim 49, wherein:

the controller is adapted to receive a specified condition signal and a mode control signal; and the controller is adapted to determine, based on the value of the mode control signal, whether to generate the I/O-device control signal using the sensed condition signal or the specified condition signal.

51. A controller for an I/O system adapted to generate an output signal from an input signal, the I/O system comprising an I/O device and a condition sensor, wherein:

the I/O device is adapted to receive the input signal and generate the output signal based on the input signal, wherein:

the generation of the output signal by the I/O device is affected by one or more environmental conditions associated with the I/O device;

the I/O device is further adapted to receive an I/O-device control signal corresponding to the one or more environmental conditions; and the I/O device is adapted to adjust the generation of the output signal based on the I/O-device control signal;

the condition sensor is adapted to generate a sensed condition signal that characterizes the one or more environmental conditions; and the controller is adapted to (i) receive the sensed condition signal from the condition sensor and a programmable offset value and (ii) modify the sensed condition signal based on the programmable offset value to generate and provide the I/O-device control signal to the I/O device, wherein:

the controller is adapted to receive a specified condition signal and a mode control signal; and the controller is adapted to determine, based on the value of the mode control signal, whether to generate the I/O-device control signal using the sensed condition signal or the specified condition signal.

52. A controller for an I/O system adapted to generate an output signal from an input signal, the I/O system comprising an I/O device and a condition sensor, wherein:

the I/O device is adapted to receive the input signal and generate the output signal based on the input signal, wherein:

the generation of the output signal by the I/O device is affected by one or more environmental conditions associated with the I/O device;

the I/O device is further adapted to receive an I/O-device control signal corresponding to the one or more environmental conditions; and the I/O device is adapted to adjust the generation of the output signal based on the I/O-device control signal;

the condition sensor is adapted to generate a sensed condition signal that characterizes the one or more environmental conditions; and the controller is adapted to (i) receive the sensed condition signal from the condition sensor, a specified condition signal, and a mode control signal, and (ii) determine, based on the value of the mode control signal, whether to generate and provide the I/O-device control signal to the I/O device using the sensed condition signal or the specified condition signal.

53. The invention of claim 52, wherein the controller is adapted to:

map the sensed condition signal to an index value;

adjust the index value based on a programmable offset value to generate an adjusted index value; and map the adjusted index value to the I/O-device control signal.

54. The invention of claim 53, wherein:

the condition sensor and the controller are adapted to receive an update signal;

the condition sensor is adapted to update the sensed condition signal at each falling edge of the update signal; and the controller is adapted to update the I/O-device control signal at each rising edge of the update signal.

55. The invention of claim 54, wherein:

the controller is adapted to receive a specified condition signal and a mode control signal; and the controller is adapted to determine, based on the value of the mode control signal, whether to generate the I/O-device control signal using the sensed condition signal or the specified condition signal.

56. The invention of claim 53, wherein:

the controller is adapted to receive a specified condition signal and a mode control signal; and the controller is adapted to determine, based on the value of the mode control signal, whether to generate the I/O-device control signal using the sensed condition signal or the specified condition signal.

57. The invention of claim 52, wherein:

the condition sensor and the controller are adapted to receive an update signal;

the condition sensor is adapted to update the sensed condition signal at each falling edge of the update signal; and the controller is adapted to update the I/O-device control signal at each rising edge of the update signal.

58. The invention of claim 57, wherein:
the controller is adapted to receive a specified condition signal and a mode control signal; and
the controller is adapted to determine, based on the value of the mode control signal, whether to generate the I/O-device control signal using the sensed condition signal or the specified condition signal.

59. The invention of claim 52, wherein:
the controller is adapted to receive a specified condition signal and a mode control signal; and
the controller is adapted to determine, based on the value of the mode control signal, whether to generate the I/O-device control signal using the sensed condition signal or the specified condition signal.

60. An input/output (I/O) system for generating an output signal from an input signal, the I/O system comprising:
a plurality of I/O devices, each adapted to receive a corresponding input signal and generate a corresponding output signal based on the corresponding input signal, wherein:
the generation of the corresponding output signal by each I/O device is affected by one or more environmental conditions associated with the I/O device;
each I/O device is further adapted to receive a corresponding I/O-device control signal corresponding to the one or more environmental conditions; and
each I/O device is adapted to adjust the generation of the corresponding output signal based on the corresponding I/O-device control signal; and
a plurality of controllers, each adapted to (i) receive a corresponding sensed condition signal from a corresponding condition sensor and a corresponding programmable offset value and (ii) modify the corresponding sensed condition signal based on the corresponding programmable offset value to generate and provide the corresponding I/O-device control signal to a corresponding I/O device.

61. The invention of claim 60, wherein:
the I/O system comprises a single condition sensor; and
each controller receives its corresponding sensed condition signal from the single condition sensor.

62. The invention of claim 60, wherein the I/O system is one of an input driver, an output driver, and an integrated circuit.

* * * * *

UNITED STATES PATENT AND TRADEMARK OFFICE
CERTIFICATE OF CORRECTION

PATENT NO. : 7,157,932 B2
APPLICATION NO. : 10/999857
DATED : January 2, 2007
INVENTOR(S) : Tony S. El-Kik, Anthony W. Seaman and Stefan A. Siegel It is certified that error appears in the above-identified patent and that said Letters Patent is hereby corrected as shown below:

In column 9, line 30, replace ";" with --:--.

Signed and Sealed this

Twenty-seventh Day of March, 2007

JON W. DUDAS
*Director of the United States Patent and Trademark Office*